United States Patent
Yoo

(10) Patent No.: US 8,531,363 B2
(45) Date of Patent: Sep. 10, 2013

(54) ORGANIC LIGHT EMITTING DIODE DISPLAY DEVICE AND METHOD OF DRIVING THE SAME

(75) Inventor: Jae-Ho Yoo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 730 days.

(21) Appl. No.: 12/659,138

(22) Filed: Feb. 26, 2010

(65) Prior Publication Data

US 2011/0063282 A1 Mar. 17, 2011

(30) Foreign Application Priority Data

Sep. 14, 2009 (KR) .................. 10-2009-0086548

(51) Int. Cl.
G09G 3/32 (2006.01)
H01J 7/24 (2006.01)

(52) U.S. Cl.
USPC .......................................... 345/82; 345/204

(58) Field of Classification Search
USPC ............... 345/214, 76–83, 204; 313/11–47; 315/169.3
See application file for complete search history.

(56) References Cited

U.S. PATENT DOCUMENTS

2006/0012590 A1* 1/2006 Takeoka ...................... 345/204
2007/0236441 A1* 10/2007 Zhang et al. .................. 345/92

FOREIGN PATENT DOCUMENTS

| JP | 01-231097 A | 9/1989 |
|---|---|---|
| JP | 05-313187 A | 11/1993 |
| JP | 2000-150895 A | 5/2000 |
| JP | 2005-181917 A | 7/2005 |
| JP | 2005181917 A * | 7/2005 |
| JP | 2005-258097 A | 9/2005 |
| JP | 2006-350311 A | 12/2006 |
| JP | 2007-086758 A | 4/2007 |
| JP | 2007-287971 A | 11/2007 |
| JP | 2007287971 A * | 11/2007 |
| JP | 2009-103732 A | 5/2009 |
| KR | 10-2004-0078324 A | 9/2004 |
| KR | 10-0673764 B1 | 1/2007 |
| KR | 10-2008-0055596 A | 6/2008 |

* cited by examiner

Primary Examiner — Amare Mengistu
Assistant Examiner — Jennifer Zubajlo
(74) Attorney, Agent, or Firm — Lee & Morse, P.C.

(57) ABSTRACT

An organic light emitting diode (OLED) display device comprises a display panel including first and second substrates, an OLED disposed between the first and second substrates, and a heating controller, a heater configured to apply heat to the display panel, and a temperature controller. The display panel has a display area and a non-display area on which the second substrate does not overlap the first substrate. The first and second substrates and the OLED are arranged in the display area. The heating controller is arranged in the non-display area. A first side and a second side of the temperature controller are electrically connected to the heater and the heating controller, respectively. The heating controller supplies a voltage to the heater when it is determined that an image is not displayed on the display panel. The temperature controller cuts electrical connection with the heater at a predetermined temperature.

20 Claims, 4 Drawing Sheets

ORGANIC LIGHT EMITTING DIODE DISPLAY DEVICE AND METHOD OF DRIVING THE SAME

BACKGROUND OF THE INVENTION

1. Field

The embodiments relate to an organic light emitting diode (OLED) display device and a method of driving the same, and more particularly, to an OLED display device that is capable of preventing characteristics of an amorphous silicon thin film transistor from being degraded and deteriorated and a method of driving the same.

2. Description of the Related Art

In general, an OLED display device includes a display panel configured to display an image, and a drive circuit configured to drive the display panel. The display panel includes an OLED formed between two substrates, and at least one thin film transistor (TFT) configured to drive the OLED.

The OLED includes an anode electrode, a cathode electrode, and an emission layer disposed between the anode electrode and the cathode electrode.

An electron injected from the cathode electrode is coupled to a hole injected from the anode electrode to form an exciton in the emission layer, and the exciton emits energy to emit light.

The TFTs may include a switching TFT configured to select a pixel, and a drive TFT configured to drive the OLED to emit light having brightness in proportion to a current.

Here, as the TFT, an amorphous silicon TFT or a polysilicon TFT may be selected considering image quality, power consumption, stability, a large-sized screen, costs, etc.

When the conventional amorphous TFT is driven for a long time, characteristics of the amorphous silicon TFT may be deteriorated. Consequently, a threshold voltage Vth may increase, and mobility of the amorphous silicon TFT may decrease.

Such a phenomenon occurs because a dangling bond is formed in an amorphous silicon thin film. The dangling bond may cause more defects in the thin film and increase in a trap density at an interface between amorphous silicon and gate oxide, and decrease in mobility of a charge.

In addition, the current required to drive the OLED is varied to generate a difference in screen display characteristics according to a unit pixel in the panel. Therefore, when characteristics of the drive TFT are changed due to degradation or deterioration of the TFT, reliability of products may be decreased.

SUMMARY

Embodiments are therefore directed to an OLED display device that is capable of preventing characteristics of an amorphous silicon thin film transistor from being degraded and deteriorated and a method of driving the same, which substantially overcome one or more of the problems due to the limitations and disadvantages of the related art.

It is therefore a feature of an embodiment to provide an organic light emitting diode display device, comprising: a display panel including a first substrate, a second substrate, an organic light emitting diode disposed between the first and second substrates, and a heating controller, the display panel having a display area and a non-display area, the non-display area being an area on which the second substrate does not overlap the first substrate, the first substrate, the second substrate, and the organic light emitting diode being arranged in the display area, and the heating controller being arranged in the non-display area; a heater configured to apply heat to the display panel; and a temperature controller, a first side of the temperature controller being electrically connected to the heater and a second side of the temperature controller being electrically connected to the heating controller.

The temperature controller may be bimetallic.

A thin film transistor may be arranged in the display area, disposed between the first and second substrates, and electrically connected to the organic light emitting diode. The thin film transistor may include a semiconductor layer made of amorphous silicon.

The heating controller may include: a determination unit configured to determine whether an image is displayed on the display panel or not, and output a state of the display panel; and a power supply unit configured to receive a signal output from the determination unit, and supply a voltage according to the received signal.

The voltage may be applied to the heater via the temperature controller.

A first side of the temperature controller may be in contact with the heater so as to be electrically connected thereto, and a second side of the temperature controller may be electrically connected to a lead terminal extending from the heating controller.

The temperature controller may be disposed in a hole formed in the first substrate, and may be in contact with the heater.

The first substrate may have an inner surface facing the second substrate and an outer surface opposite to the inner surface. The heater may be disposed on the outer surface of the first substrate, and have a size corresponding to the first substrate.

The first substrate may have an inner surface facing the second substrate and an outer surface opposite to the inner surface. The heater may be disposed on the outer surface of the first substrate, and has a size corresponding to the display area.

An auxiliary layer may be disposed on a first region of the outer surface of the first substrate other than a second region of the first substrate, and the second region is a region on which the heater is disposed.

The temperature controller may be disposed on a side surface of the heater so as to be in contact with the heater.

The first substrate may have an inner surface facing the second substrate and an outer surface opposite to the inner surface. The heater may be disposed on an inner surface of the first substrate, and have a size corresponding to the display area.

The temperature controller may further be configured to bend the first side of the temperature controller in a direction opposite to the heater at a predetermined temperature so as to cut electrical connection between the temperature controller and the heater.

It is therefore another feature of an embodiment to provide a method of driving an organic light emitting diode display device comprising a display panel, a heater, a power supply unit, and a temperature controller, the method comprising: determining whether an image is displayed on the display panel or not; outputting a voltage from the power supply unit when it is determined that the image is not displayed on the display panel; applying the output voltage to the heater via the temperature controller; applying heat to the display panel with the heater; and cutting off the voltage applied to the heater at a predetermined temperature using the temperature controller.

The predetermined temperature may be a temperature of an amorphous silicon thin film included in the display panel. The predetermined temperature may be in a range of 80 to 100° C.

When a first side of the temperature controller is electrically connected to the power supply unit, and a second side of the temperature controller is electrically connected to the heater, the voltage output from the power supply unit may be applied to the heater.

The first side of the temperature controller in contact with the heater may be bent in a direction opposite to the heater at the predetermined temperature, and the voltage applied to the heater may be cut off.

When a first side of the temperature controller is connected to a lead terminal extending from the power supply unit and a second side of the temperature controller is in contact with the heater, the voltage output from the power supply unit may be applied to the heater.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
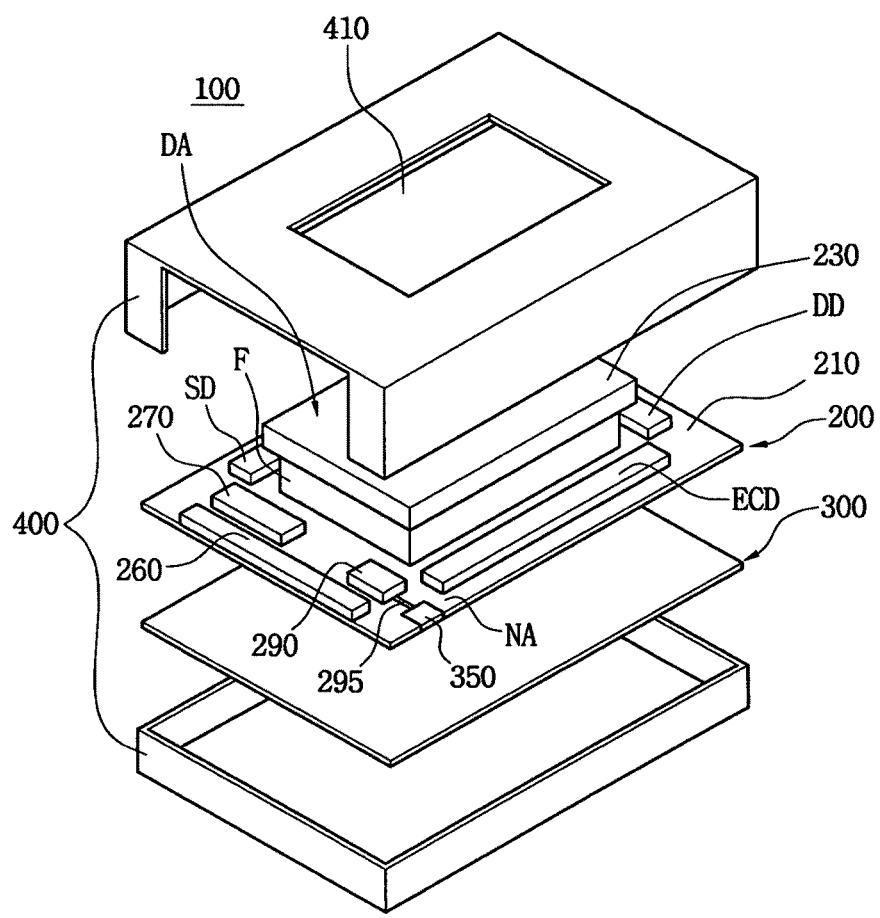
FIG. 1 illustrates a perspective, exploded view of an OLED display device in accordance with an exemplary embodiment.

Korean Patent Application No. 10-2009-0086548, filed on Sep. 14, 2009, in the Korean Intellectual Property Office, and entitled: "Organic Light Emitting Diode Display Device and Method of Driving the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
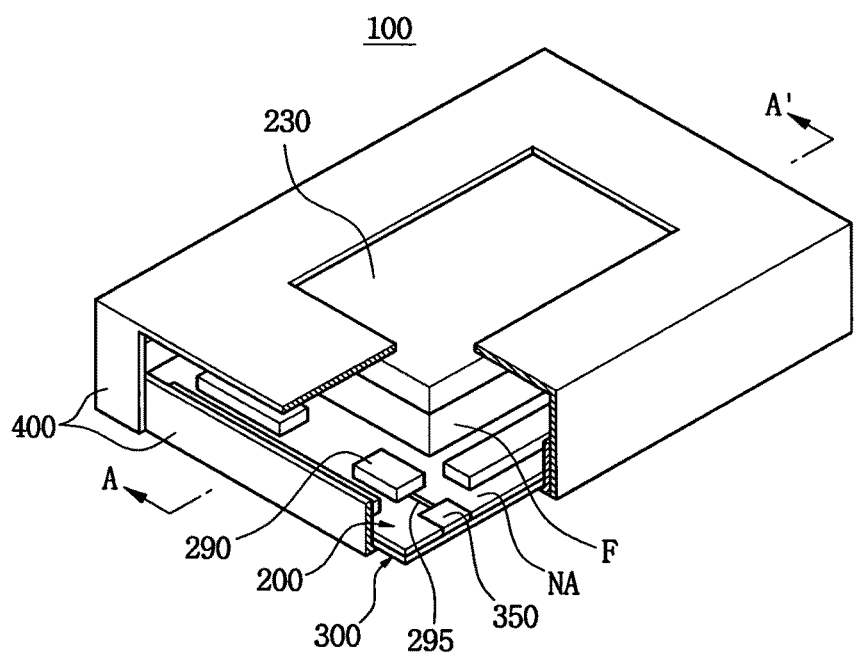
FIG. 2 illustrates a perspective cutaway view of the assembled OLED display device of FIG. 1.
Figure 3:
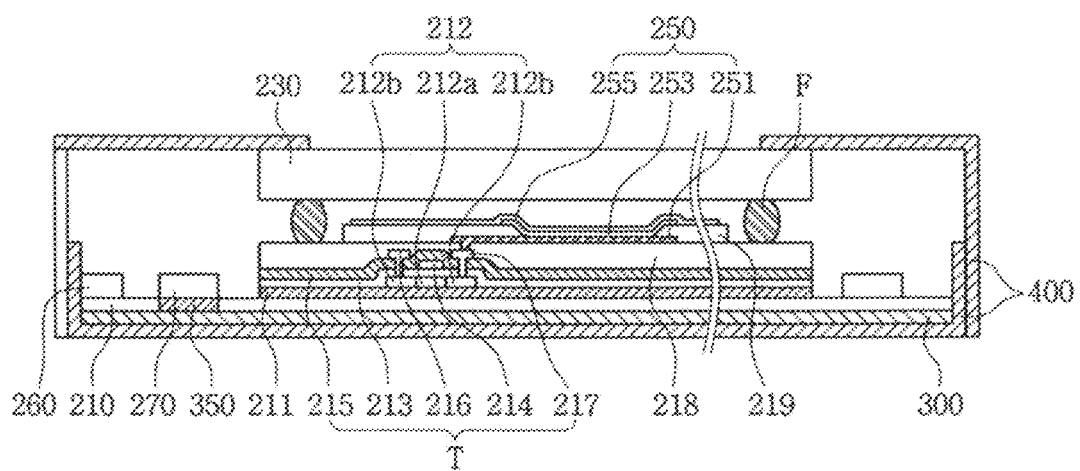
FIG. 3 illustrates a cross-sectional view of the OLED display device along the line A-A' shown in FIG. 2.

FIG. 1 is a perspective, exploded view of an OLED display device in accordance with an exemplary embodiment. FIG. 2 is a perspective cutaway view of the assembled OLED display device of FIG. 1. FIG. 3 is a cross-sectional view of the OLED display device along the line A-A' shown in FIG. 2.

Referring to FIGS. 1 to 3, an OLED display device 100 may include a display panel 200 which includes a heating controller 290, a heater 300 configured to supply heat to the display panel 200, and a temperature controller 350. The temperature controller 350 may be configured to selectively connect or block a current flow between the heating controller 290 and the heater 300. The heater 300 may be disposed outside or inside the display panel 200. A first side of the temperature controller 350 may be electrically connected to the heating controller 290. A second side of the temperature controller 350 may be electrically connected to the heater 300. The temperature controller 350 may be bimetallic.

The position of the temperature controller 350 is not specifically limited. Since the temperature controller 350 may be electrically connected to the heating controller 290 and the heater 300, the temperature controller 350 may be disposed in the vicinity of the heating controller 290 and the heater 300.

In addition, the OLED display device 100 may further include a receiving vessel 400 configured to receive the display panel 200, the heater 300, and the temperature controller 350.

The receiving vessel 400 may have a transparent area or an opening 410 configured to expose an image displayed on the display panel 200 to the outside.

The display panel 200 may be provided in a small mobile device such as a mobile phone, a PDP, etc. Also, the display panel 200 may be provided in a large display such as a television, etc.

The display panel 200 may have a display area DA and a non-display area NA. The display area DA may display an image according to an external signal. In the display area DA, a first substrate 210, a second substrate 230, and a single or a plurality of OLEDs 250 disposed between the first substrate 210 and the second substrate 230 may be arranged.

Here, sealing material such as frit F may be applied along a periphery of the first substrate 210 or the second substrate 230. Heat may be applied to the frit to plasticize the frit. Consequently, the first and second substrates 210 and 230 may be adhered so as to seal the single or the plurality of OLEDs 250 and protect the OLEDs 250 from external gas, moisture, air, etc.

In the display area DA, a single or a plurality of TFTs T may be disposed between the first and second substrates 210 and 230. The single or the plurality of TFTs T may be configured to control emission of light from the OLEDs 250. The single or the plurality of TFTs T may be electrically connected to the OLEDs 250, respectively. In FIG. 3, a cross-sectional view of the OLED display device, including the OLEDs 250 and the TFTs T in the display area DA is illustrated. The illustrated cross-sectional view includes formation of the OLEDs 250 and the TFTs T on the first substrate 210.

A buffer layer 211 may be formed on the first substrate 210. A semiconductor layer 212 including an active region 212a and source/drain regions 212b may be patterned and formed on the buffer layer 211.

Here, the semiconductor layer 212 may be formed by applying an amorphous silicon thin film on the buffer layer 211, and then removing a portion of the amorphous silicon thin film in an etching process.

A gate insulating layer 213 may be formed on the semiconductor layer 212 and a part of the buffer layer 211. On the part of the buffer layer 211, the semiconductor layer 212 is not formed. A gate electrode 214 may be patterned and formed on the gate insulating layer 213 so as to correspond to the active region 212a.

An interlayer insulating layer 215 may be formed on the gate electrode 214 and a part of the gate insulating layer 213. On the part of the date insulating layer 213, the gate electrode 214 is not formed. The gate insulating layer 213 and the interlayer insulating layer 215 may be partially removed so as to expose portions of the source/drain regions 212b.

Source and drain electrodes 216 and 217 may be patterned and formed on the interlayer insulating layer 215, and connected to the exposed portions of the source and drain regions 212b.

A planarization layer 218 may be formed on the source and drain electrodes 216 and 217 and a part of the interlayer insulating layer 215. On the part of the interlayer insulating layer 215, the source and drain electrodes 216 and 217 are not formed. A portion of the planarization layer 218 may be removed so as to expose a portion of one of the source and drain electrodes 216 and 217.

A first electrode 251 may be patterned and formed on the planarization layer 218, and connected to the exposed portion of one of the source and drain electrodes 216 and 217.

A pixel defining layer 219 having an opening (not shown) may be formed on the first electrode 251 and a part of the planarization layer 218 so as to expose a portion of the first electrode 251. On the part of the planarization layer 218, the first and second electrodes 251 are not formed.

An organic layer 253 may be formed on the first electrode 251 exposed through the opening (not shown) of the pixel defining layer 219. A second electrode 255 may be formed on the organic layer 253 and a part of the pixel defining layer 219. On the part of the pixel defining layer 219, the organic layer 253 is not formed.

The non-display area NA may be an area in which the second substrate 230 does not overlap the first substrate 210. A pad part 260, which may be pads (not shown) extending from the display area DA, may be disposed in the non-display area NA.

In addition, various devices such as a controller 270, a scan driver SD, a data driver DD, an emission control driver ECD, etc., may be disposed in the non-display area NA to control operations required for displaying an image by the OLEDs 250 according to external signals.

Furthermore, the heating controller 290 may be disposed in the non-display area NA. The heating controller 290 may be electrically connected to the temperature controller 350, and supply a voltage to the heater 300 electrically connected to the temperature controller 350.

Figure 4:
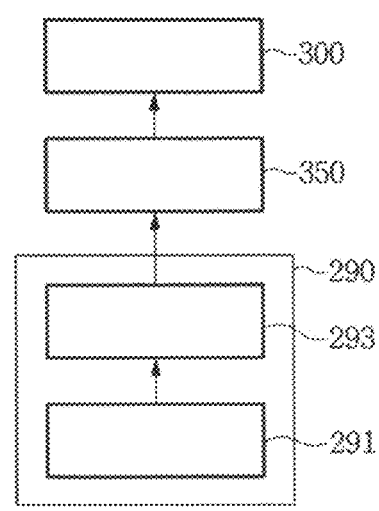
FIG. 4 is a block diagram illustrating schematic configuration of a heating controller in accordance with an exemplary embodiment.

FIG. 4 is a block diagram illustrating schematic configuration of a heating controller in accordance with an exemplary embodiment.

Referring to FIG. 4, the heating controller 290 may include a determination unit 291 and a power supply unit 293. The determination unit 291 is configured to determine whether an image is displayed on the display panel 200 or not, and output a signal indicating a state of the display panel 200. The power supply unit 293 is configured to receive the signal output from the determination unit 291, and supply a voltage to the heater 300 via the temperature controller 350.

Here, the heating controller 290 may supply a voltage to the heater 300 when it is determined that an image is not displayed on the display panel 200. The heating controller 290 may not supply a voltage to the heater 300 when it is determined that an image is displayed on the display panel 200.

The heater 300 may be formed of a metal thin film having high thermal conductivity. The heater 300 may be disposed on one surface (an outer surface) of the first substrate 210 opposite to the other surface (an inner surface). The other surface or the inner surface faces the second substrate. On the other surface, the TFT T and the OLED 250 may be formed. The heater 300 may have a size corresponding to the first substrate 210.

Here, a first side of the temperature controller 350 may be in contact with the heater 300 so as to be electrically connected thereto. A second side of the temperature controller 350 may be electrically connected to the heating controller 290, more specifically, to a lead terminal 295 extending from the power supply unit 293.

Of course, while the first side of the temperature controller 350 may be in contact with the heater 300, the temperature controller 350 may be connected to the heater 300 using a lead terminal, a wire, etc., not limited thereto. Various connection manners may be used according to positions of the heating controller 290, the heater 300, and the temperature controller 350.

Here, the lead terminal 295 may be insulated from the heater 300 to prevent the lead terminal from contacting the heater 300 directly.

The position of the temperature controller 350 is not specifically limited. The temperature controller 350 may be disposed in a hole formed in the first substrate 210 so that the first side of the temperature controller 350 may be in contact with the heater 300.

When a voltage supplied from the power supply unit 293 is applied to the heater 300 via the temperature controller 350, heat may be generated from the temperature controller 350. When the temperature of the temperature controller 350 may increase to a certain temperature or more by the heat, the first side of the temperature controller 350 in contact with the heater 300 may be bent in a direction opposite to the heater 300 so as to cut electrical connection between the temperature controller 350 and the heater 300.

Figure 5:
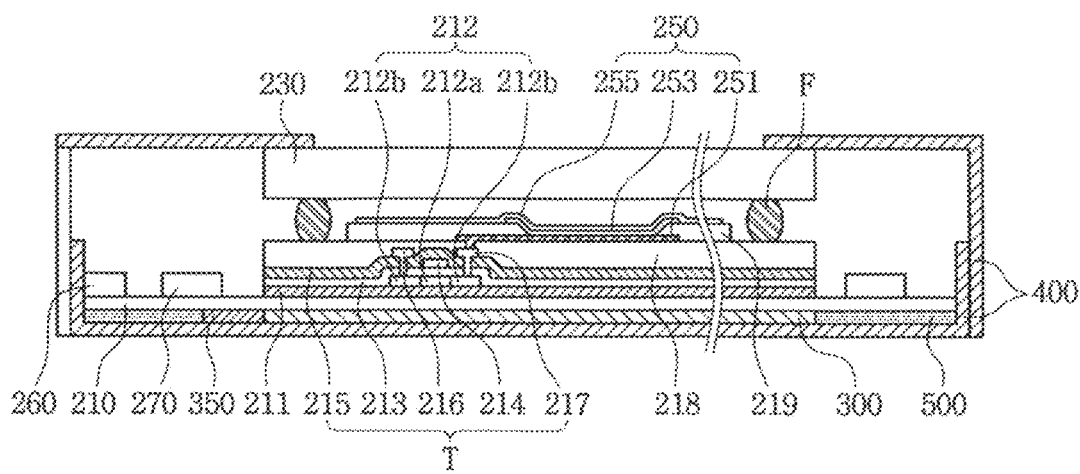
FIG. 5 illustrates a cross-sectional view of an OLED display device in accordance with another exemplary embodiment.

FIG. 5 illustrates a cross-sectional view of an OLED display device in accordance with another exemplary embodiment.

Referring to FIG. 5, the heater 300 may be disposed at an outer surface of the first substrate 210. The heater 300 may be formed to have a size corresponding to the display area DA.

Here, to compensate the height, an auxiliary layer 500 having the same thickness as the heater 300 may be disposed at a first region of the outer surface of the first substrate 210 other than a second region the outer surface of the first substrate 210. The heater 300 is disposed on the second region.

In the case that the heater 300 has a size corresponding to the display area DA and the temperature controller 350 is disposed as shown in FIGS. 1 to 3, it may be difficult to bring the temperature controller 350 in contact with the heater 300.

Therefore, the temperature controller 350 may be disposed at a side surface of the heater 300 so as to be in contact with the heater 300, while the lead terminal 295 may further extend so as to be connected to the temperature controller 350.

Figure 6:
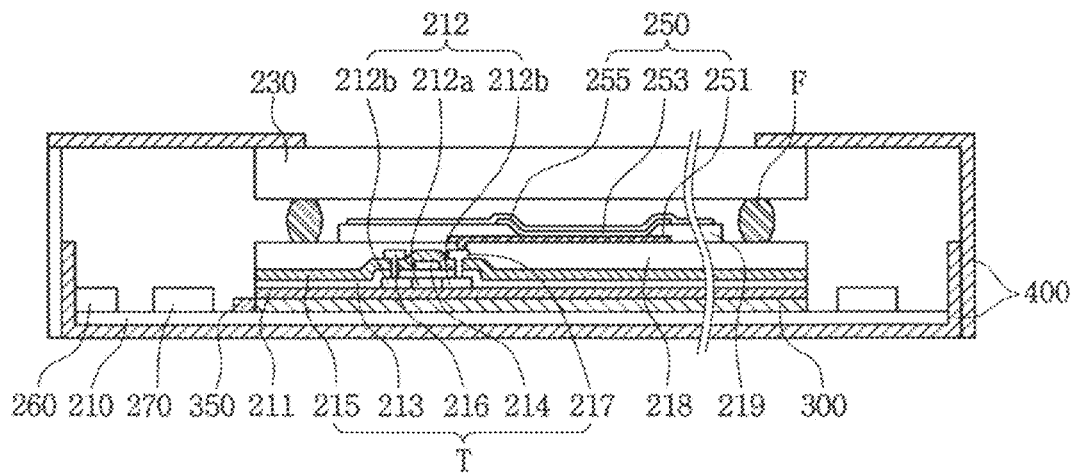
FIG. 6 illustrates a cross-sectional view of an OLED display device in accordance with another exemplary embodiment.

FIG. 6 illustrates a cross-sectional view of an OLED display device in accordance with another exemplary embodiment.

Referring to FIG. 6, the heater 300 may be disposed on the inner surface of the first substrate 210. That is, the first substrate 210, the heater 300, and the buffer layer 211 may be sequentially formed, while the TFT T and the OLED 250 may be formed on the buffer layer 211. That is, the heater 300 may be disposed between the first substrate 210 and the buffer layer 211, and have a size corresponding to the display area DA.

Here, the temperature controller 350 may be formed on the inner surface of the first substrate 210 so as to be disposed at a side surface of the heater 300 to readily contact the heater 300.

Here, operation of the OLED display device is briefly described. The determination unit 291 may determine whether an image is displayed on the display panel 200 or not. When it is determined that the image is not displayed on the display panel 200, the power supply unit 293 may generate and output a voltage. The output voltage may be transmitted to the heater 300 via the temperature controller 350.

When it is determined that the image is displayed on the display panel 200, the power supply unit 293 may not output the voltage, and no power may be supplied to the heater 300.

The temperature of the heater 300 may be increased by the supplied voltage for generating heat to be applied to the panel including the TFT.

The amorphous silicon thin film, which forms the semiconductor layer 212, has thermal annealing characteristics that may recover from deterioration when heat is applied. Therefore, the TFT's characteristics deteriorated by the image displaying operation may be recovered by the applied heat.

However, excessive heat may change characteristics of the amorphous silicon thin film, and also affect the other elements of the display panel. Therefore, the voltage applied to the heater should be cut off when the amorphous silicon thin film reaches a certain temperature.

The temperature controller 350 may be provided to prevent the temperature from increasing to a predetermined temperature or more. When the temperature is the predetermined temperature or more, the temperature controller 350 may be bent so as to cut off the electrical connection between the heating controller and the heater. Accordingly, no power may be supplied to the heater, and thus no heat may be applied to the panel.

When the temperature of the amorphous silicon thin film is too low, a sufficient amount of heat may not be supplied to recover the deteriorated characteristics. When the temperature is too high, the characteristics may not be changed. Therefore, the temperature of the amorphous silicon thin film may be selected in a range of 80 to 100° C.

As described above, by applying heat to the panel including the TFT formed of an amorphous silicon thin film, degradation and deterioration in characteristics of the amorphous silicon TFT may be prevented.

What is claimed is:

1. An organic light emitting diode display device, comprising:
    a display panel including a first substrate, a second substrate, an organic light emitting diode disposed between the first and second substrates such that the first substrate is under the organic light emitting diode, and a heating controller, the display panel having a display area and a non-display area, the non-display area being an area on which the second substrate does not overlap the first substrate, wherein the first substrate, the second substrate, and the organic light emitting diode are arranged in the display area, and the heating controller is arranged in the non-display area;
    a heater configured to apply heat to the display panel, the heater being under the first substrate and overlapping at least an entirety of the display area; and
    a temperature controller, a first side of the temperature controller being electrically connected to the heater and a second side of the temperature controller being electrically connected to the heating controller.

2. The organic light emitting diode display device as claimed in claim 1, wherein the temperature controller is bimetallic.

3. The organic light emitting diode display device as claimed in claim 1, wherein a thin film transistor is arranged in the display area, is disposed between the first and second substrates, and is electrically connected to the organic light emitting diode, and
    the thin film transistor includes a semiconductor layer made of amorphous silicon.

4. The organic light emitting diode display device as claimed in claim 1, wherein the heating controller includes:
    a determination unit configured to determine a state of the display panel based on whether an image is displayed on the display panel or not, and to output the state of the display panel; and
    a power supply unit configured to receive a signal output from the determination unit based on the state of display panel, and to supply a voltage according to the received signal to the heating controller, the heater being configured to apply the heat to the display panel based on the state of the display panel received from the heating controller.

5. The organic light emitting diode display device as claimed in claim 1, wherein a first side of the temperature controller is in contact with the heater so as to be electrically connected thereto, and a second side of the temperature controller is electrically connected to a lead terminal extending from the heating controller.

6. The organic light emitting diode display device as claimed in claim 5, wherein the temperature controller is disposed in a hole formed in the first substrate, and is in contact with the heater.

7. The organic light emitting diode display device as claimed in claim 1, wherein the first substrate has an inner surface facing the second substrate and an outer surface opposite to the inner surface, and
    wherein the heater is disposed on the outer surface of the first substrate, and has a size corresponding to the first substrate.

8. The organic light emitting diode display device as claimed in claim 1, wherein the first substrate has an inner surface facing the second substrate and an outer surface opposite to the inner surface, and
    wherein the heater is disposed on the outer surface of the first substrate, and has a size corresponding to the display area.

9. The organic light emitting diode display device as claimed in claim 8, wherein an auxiliary layer is disposed on a first region of the outer surface of the first substrate other than a second region of the first substrate, and the second region is a region on which the heater is disposed.

10. The organic light emitting diode display device as claimed in claim 8, wherein the temperature controller is disposed on a side surface of the heater so as to be in contact with the heater.

11. The organic light emitting diode display device as claimed in claim 1, wherein the first substrate has an inner surface facing the second substrate and an outer surface opposite to the inner surface, and
    wherein the heater is disposed on an inner surface of the first substrate, and has a size corresponding to the display area.

12. The organic light emitting diode display device as claimed in claim 11, wherein the temperature controller is disposed on a side surface of the heater so as to be in contact with the heater.

13. The organic light emitting diode display device as claimed in claim 1, wherein the temperature controller is further configured to bend the first side of the temperature controller in a direction opposite to the heater at a predetermined temperature so as to cut electrical connection between the temperature controller and the heater.

14. A method of driving an organic light emitting diode display device comprising a display panel, a heater, a power supply unit, and a temperature controller, the method comprising:
   determining whether an image is displayed on the display panel or not;
   outputting a voltage from the power supply unit when it is determined that the image is not displayed on the display panel;
   applying the output voltage to the heater via the temperature controller;
   applying heat to the display panel with the heater; and
   cutting off the voltage applied to the heater at a predetermined temperature using the temperature controller.

15. The method as claimed in claim 14, wherein the predetermined temperature is a temperature of an amorphous silicon thin film included in the display panel, and in a range of 80 to 100° C.

16. The method as claimed in claim 14, wherein when a first side of the temperature controller is electrically connected to the power supply unit, and a second side of the temperature controller is electrically connected to the heater, the voltage output from the power supply unit is applied to the heater.

17. The method as claimed in claim 16, wherein the first side of the temperature controller in contact with the heater is bent in a direction opposite to the heater at the predetermined temperature, and the voltage applied to the heater is cut off.

18. The method as claimed in claim 14, wherein when a first side of the temperature controller is connected to a lead terminal extending from the power supply unit and a second side of the temperature controller is in contact with the heater, the voltage output from the power supply unit is applied to the heater.

19. The method as claimed in claim 18, wherein the first side of the temperature controller in contact with the heater is bent in a direction opposite to the heater at the predetermined temperature, and the voltage applied to the heater is cut off.

20. The method as claimed in claim 14, wherein:
   determining whether the image is displayed on the display panel includes having a determination unit of the temperature controller output a signal indicating an on-state or an off-state of image display on the display panel to the power supply unit,
   outputting the voltage from the power supply unit occurs only when the signal from the determination unit indicates the off-state of image display on the display panel, and
   during the off-state of image display on the display panel, the voltage from the power supply unit is applied to the heater and the heat is applied to the display panel with the heater such that a temperature of the display panel is increased with the heater.

* * * * *